United States Patent
Kulkarni et al.

(10) Patent No.: US 6,775,423 B2
(45) Date of Patent: Aug. 10, 2004

(54) SYSTEMS AND METHODS FOR INCREMENTALLY UPDATING AN IMAGE IN FLASH MEMORY

(75) Inventors: Harish Kulkarni, Bellevue, WA (US); Jason W. Fuller, Bellevue, WA (US); Michael K. Fleming, Santa Cruz, CA (US)

(73) Assignee: Microsoft Corporation, Redmond, WA (US)

( * ) Notice: Subject to any disclaimer, the term of this patent is extended or adjusted under 35 U.S.C. 154(b) by 608 days.

(21) Appl. No.: 09/757,308

(22) Filed: Jan. 8, 2001

(65) Prior Publication Data

US 2002/0034105 A1 Mar. 21, 2002

(Under 37 CFR 1.47)

Related U.S. Application Data

(60) Provisional application No. 60/201,582, filed on May 3, 2000.

(51) Int. Cl.[7] .............................. G06K 9/54; G06F 9/44; G06F 12/00; G06F 15/16
(52) U.S. Cl. ....................... 382/305; 717/168; 707/203; 709/246; 711/100
(58) Field of Search ................................. 382/305, 232, 382/284; 713/100; 707/10, 203; 345/551; 709/227, 217, 213, 246, 203; 710/20; 717/168–178; 711/1, 100, 200, 206

(56) References Cited

U.S. PATENT DOCUMENTS

| | | | | |
|---|---|---|---|---|
| 5,832,520 A | * | 11/1998 | Miller | 707/203 |
| 6,269,371 B1 | * | 7/2001 | Ohnishi | 707/10 |
| 6,345,308 B1 | * | 2/2002 | Abe | 709/248 |
| 6,356,961 B1 | * | 3/2002 | Oprescu-Surcobe | 710/20 |
| 6,425,125 B1 | * | 7/2002 | Fries et al. | 717/168 |
| 6,542,906 B2 | * | 4/2003 | Korn | 707/203 |
| 6,636,876 B1 | * | 10/2003 | Ishihara et al. | 707/202 |

* cited by examiner

Primary Examiner—Kanji Patel
(74) Attorney, Agent, or Firm—Lee & Hayes, PLLC

(57) ABSTRACT

Systems and methods for incrementally updating a first image in flash memory of a device by downloading a differences file that identifies differences between the first image and a second image and applying the differences file to the first image to create the second image in the flash memory. The updating is performed incrementally by writing portions of the second image to the flash memory, each portion being of a standard block size acceptable for writing to the flash memory.

29 Claims, 7 Drawing Sheets

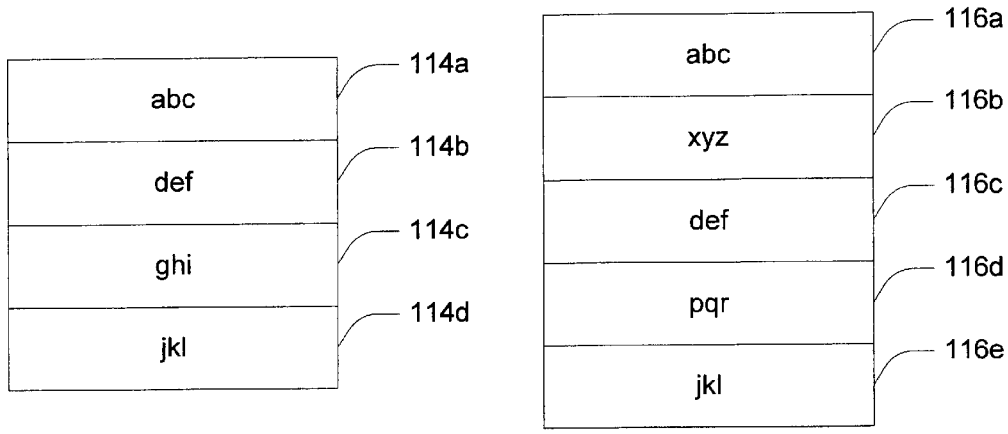
OLD IMAGE 114
*Fig. 2a*
NEW IMAGE 116
*Fig. 2b*
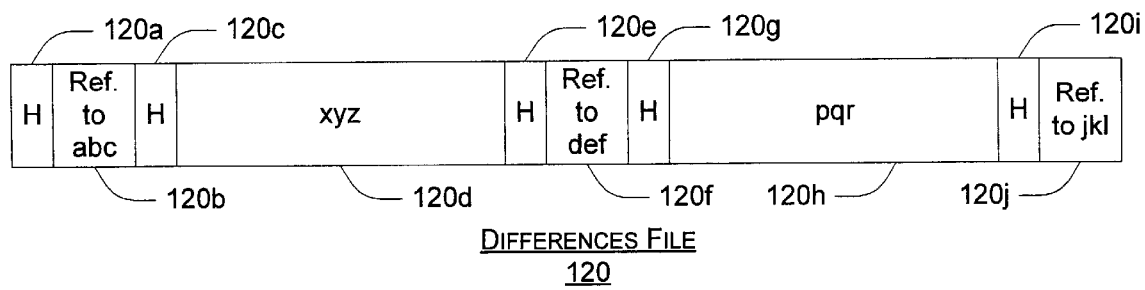
DIFFERENCES FILE 120
*Fig. 2c*
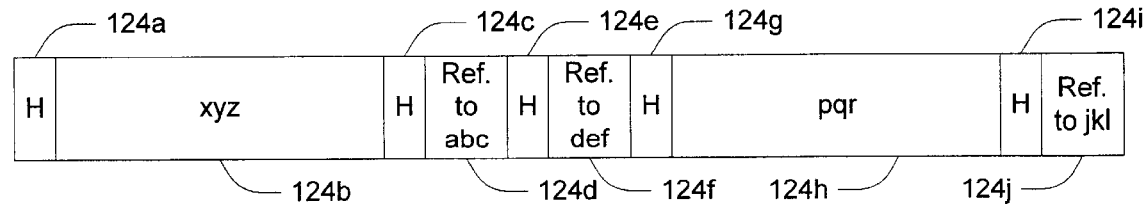
MODIFIED DIFFERENCES FILE 124
*Fig. 2d*

SYSTEMS AND METHODS FOR INCREMENTALLY UPDATING AN IMAGE IN FLASH MEMORY

This application claims priority to a provisional patent application No. 60/201,582, entitled "Incremental Dial-up Bootloader," filed on May 3, 2000 by the inventors of this application.

TECHNICAL FIELD

This invention relates to incrementally updating an image in flash memory and, more particularly, to a dial-up bootloader for remotely updating an operating system image in flash memory of an electronic device.

BACKGROUND

Computer electronic devices, such as a set-top box or a hand-held computer, utilize flash memory to store computer programs, e.g., operating systems and applications. Flash memory is semiconductor memory that can operate as ROM (read only memory) but, on an activating signal, can rewrite its contents as though it were random access memory (RAM). Flash memory is the industry standard for non-volatile storage in embedded applications.

Operating systems and applications are stored in flash memory as execute-in-place (XIP) images. Execute-in-place functionality is the ability to run an application directly from flash memory, instead of copying the application into RAM and running it from there. This functionality preserves system resources.

Although the XIP image format is efficient for execution purposes, it is not a file system and was not designed to be modified. Therefore, making a change to an XIP image is an overhead-intensive process that requires constructing a completely new image, downloading the new image to random access memory of the electronic device, and reprogramming the flash memory of the device.

One application that is utilized by electronic devices is a dial-up bootloader. A dial-up bootloader is a mechanism to update an image on a device—including a device operating system—by booting into a dial-up bootloader (DUB) operating system that is smaller than the device operating system. The DUB operating system contains the necessary information to dial into a server, download a latest version of the device operating system, and update the operating system on the device. In the case of a dial-up bootloader, the entire device operating system is downloaded.

The image is usually downloaded over a modem. If the size of the image is significant, i.e., several megabytes, this process can take up to an hour to complete. This is an unacceptably long time for a customer to wait, especially when the change to the image is actually quite minor, such as a minor bug fix.

A compression technique that utilized a differences file may be used to reduce the size of data transmitted to update an image. A differences file represents a new image in terms of an old image, plus new data. Any part of the new image that also exists in the old image is represented as a reference to the original data. This representation is efficient because the reference is much smaller than the original data itself. As a result, the differences file is typically much smaller than the new image. Download time is, therefore, significantly reduced.

The differences file contains a series of copy and data sections. A copy section is a section in the original image that has not changed in the updated image. A copy section indicates that a portion of the new image can be found in the old image at the address given in the copy section. A data section consists of a portion of the new image that is not found in the old image.

As an old image is updated, portions of the old image are overwritten with portions of the new image. Because later copy sections may refer to and use sections in the old image that have already be overwritten, the new image cannot simply be written in sequential order over the old image. Methods using a differences file, therefore, have traditionally created the new image in RAM—drawing data from the old image in flash memory and the new image at the server—before transferring the image from the RAM to the flash memory. When dealing with compact electronic devices, a desirable solution will not utilize such a large amount of RAM, since device RAM is modest so as to conform to the compact, low-cost objective of the compact device.

Therefore, one problem overcome by the implementations described herein is reducing the number of sections transmitted while, at the same time, preserving image sections that are used to construct other image sections.

Another problem arises because flash memory can only be written in a predefined block size (a write to flash memory is defined by a block address and block size). If an entire block of flash memory is written before later sections are written that depend on the overwritten block of memory, then the later sections cannot be constructed. Therefore, the block of flash memory must be written so that it does not overwrite data sections on which later sections depend.

SUMMARY

The implementations described herein create and utilize a differences file to create a new image in flash memory of an electronic device from sections of an old image in the flash memory and sections of a new image, the new image being an updated version of the old image. The new image is created incrementally in flash memory so that an entire image does not have to first be constructed in device RAM, thereby saving significant overhead. A "flash manager" is described which allows the new image to be built incrementally until a memory block is created that is of sufficient size to be written to the flash memory.

For example, if the flash memory has a block size of 64 Kb and the image to be written is 10 Mb, then the flash manager will create one or more memory blocks in RAM as it constructs the new image. Each RAM memory block corresponds to one flash memory block. When at least one-half of the RAM memory block (32 Mb) is filled with data, then the memory block is written to the flash memory. The flash manager continues to create memory blocks of the image in RAM as necessary, and writes a memory block to the flash memory whenever it is at least half full. Because the new image is not constructed sequentially, i.e., the first block of the new image is not necessarily constructed first, the memory blocks are not written sequentially. The writing process continues until the entire 10 Mb image is stored in the flash memory. This procedure requires much less than the 10 Mb of RAM that would normally be required if the entire image was created in RAM before being written to the flash memory.

The size of a block that may be written to flash memory depends upon the particular type of flash memory. Some flash memory has a 32 Kb write block size, while other flash memory may accept write blocks of 64 Kb or more.

Therefore, the flash manager is configured so that the block size is variable and can be changed to suit the write block size of any particular type of flash memory.

In addition to the code that runs on the device itself, the incremental dial-up bootloader includes two tools that execute on a personal computer from which the new image is downloaded. A first program is a compression program responsible for generating the differences file. A second program takes the differences file and reorders the sections to allow the flash memory to be reprogrammed without first having to reconstruct the complete new image in RAM before programming it to flash memory.

To accomplish this, the second program must identify dependent sections that require data from other sections and order the sections so that a dependent section is written before the sections from which it requires data. This is because the new image is incrementally written over the old image and, if the sections from which data is taken are written first, the dependent sections will not be able to access the data required to build the dependent sections.

A solution is also described in the case where dependent sections require data from each other (cyclic references) and, therefore, one cannot be written before the other without preventing the other from being constructed. In this case, graph theory analysis is used to determine the most efficient way to eliminate the cyclic references. Cyclic references are eliminated by replacing the smallest amount of references (copy sections) possible with data sections.

BRIEF DESCRIPTION OF THE DRAWINGS

FIGS. 2a–d are illustrations depicting the file structure of an old image, a new image, a differences file, and a modified differences file.

DETAILED DESCRIPTION

Figure 1:
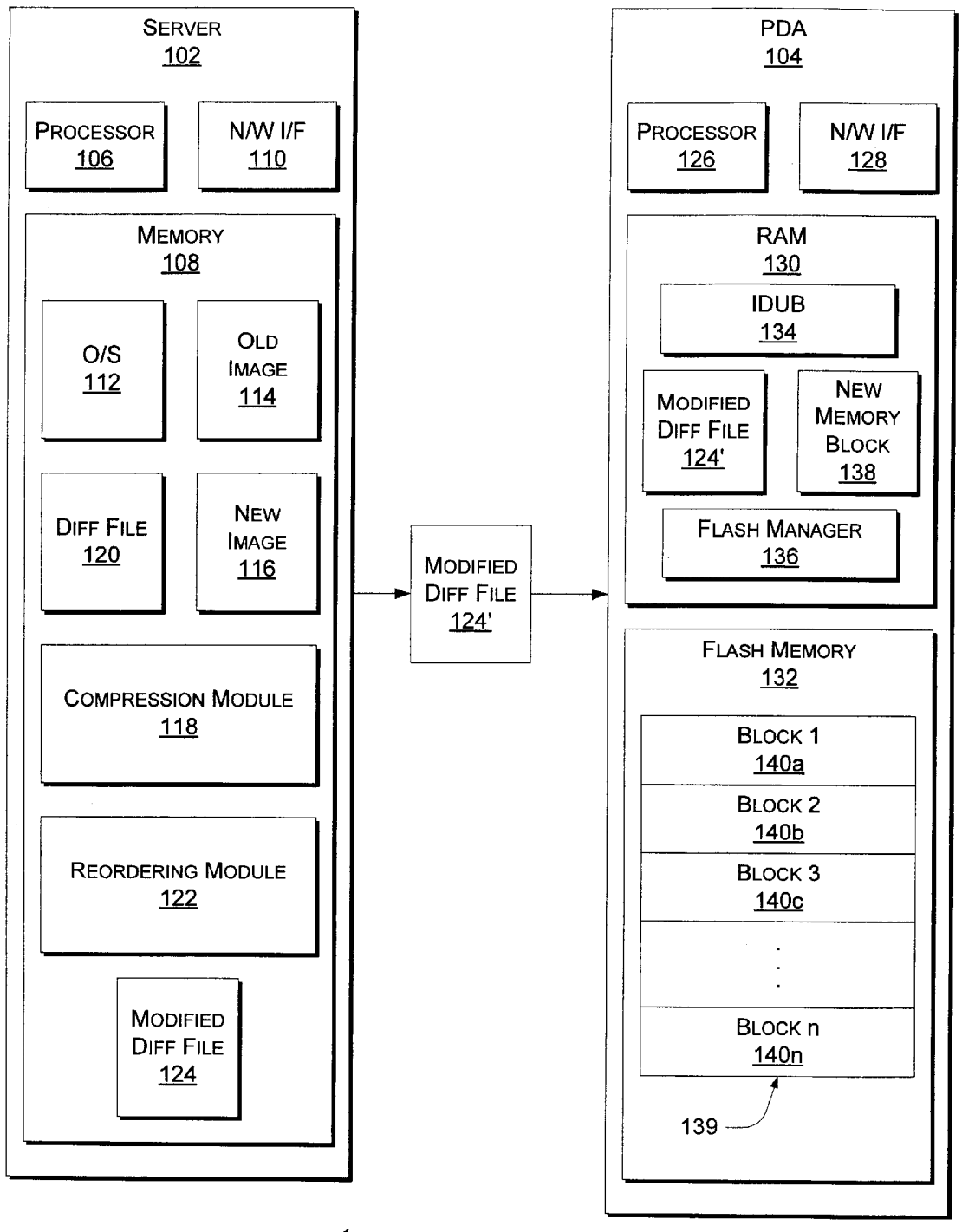
FIG. 1 is a block diagram generally illustrating aspects of a system of one implementation described herein.

The invention is illustrated in the drawings as being implemented in a suitable computing environment. Although not required, the invention will be described in the general context of computer-executable instructions, such as program modules, to be executed by a computing device, such as a personal computer or a hand-held computer or electronic device. Generally, program modules include routines, programs, objects, components, data structures, etc. that perform particular tasks or implement particular abstract data types. Moreover, those skilled in the art will appreciate that the invention may be practiced with other computer system configurations, including multi-processor systems, microprocessor-based or programmable consumer electronics, network PCs, minicomputers, mainframe computers, and the like. The invention may also be practiced in distributed computing environments where tasks are performed by remote processing devices that are linked through a communications network. In a distributed computing environment, program modules may be located in both local and remote memory storage devices.

FIG. 1 is a system 100 implemented to incrementally update an image in flash memory. The system 100 includes a server 102 and a personal digital assistant (PDA) 104. The PDA 104 may be any type of electronic computing device that has flash memory and the capability to update an image in the flash memory.

The server 102 includes a processor 106, memory 108 and a network interface 110 for communicating with remote computing devices over a network, such as the Internet. The memory 108 includes an operating system 112, an old image 114 and a new image 116. The old image 114 is an execute-in-place (XIP) image to be stored in and run from flash memory. The old image 114 may be any image that can be stored in flash memory, but for purposes of the present discussion, the old image 114 is an operating system for the PDA 104.

The new image 116 is an updated version of the old image 114. In the present example, the new image 116 is a later version of the operating system represented by the old image 114. The new image 116 contains sections of data that are identical to sections of data in the old image 114. The new image 116 also contains sections of data that are not included in the old image 114.

The memory 108 also includes a compression module 118 configured to create a differences file 120 from the old image 114 and the new image 116. The differences file 120 is transmitted by the server 102 to the PDA 104. Therefore, compressing the differences file 120 prior to transmitting it to the PDA 104 significantly reduces the time required to transmit the differences file 120 to the PDA 104. The compression module 118 constructs the differences file 120 by including the new data sections contained in the new image 116. For the data sections in the new image 116 that are also contained in the old image 114, the compression module 118 includes references in the differences file 120 to the data sections in the old image 114. Since a reference is typically much smaller than a data section it references, the differences file 120 is significantly smaller than the new image 116.

A reordering module 122 is also included in the memory 108. The reordering module 122 is configured to identify data sections in the differences file 120 that require data from data sections in the old image 114 to be created. Such data sections are called dependent data sections because they depend on other sections—particularly, referenced data sections—for constructions.

As this discussion progresses, it will be seen that a new image is constructed from the differences file and the old image, overwriting the old image as it is built. Therefore, if a dependent section requires data from a referenced section from the old image that has previously been overwritten, then it will be impossible to construct the dependent section.

To avoid problems arising from this consequence, the reordering module orders the data sections and references so that any dependent data section precedes, in the order, any referenced data section from which it requires data. In this way, all data required for building the dependent data sections will be available when needed. The reordered data sections and references are stored in the memory 108 as a modified differences file 124. The function of the reordering module 118 will be discussed in greater detail below.

The PDA 104 includes a processor 126 and a network interface 128 for communicating with the server 102 over a network, such as the Internet. The PDA 104 also includes a random access memory (RAM) 130 and flash memory 132. An incremental dial-up bootloader (IDUB) 134 is stored in the RAM 130. The RAM 130 also contains a flash manager 136, a new memory block 138 to store portions of a new image as it is being built, and a modified differences file 124', which is a copy of the modified differences file 124 that is on the server 102. It is noted that the RAM 130 may include more than one new memory blocks 138. However, for discussion purposes, only one new memory block 138 is shown.

The flash memory 132 contains an operating system 139, which is initially the old image 114 but which will be updated to the new image 116. The operating system 139 in flash memory 132 is made up of several blocks of memory, block 1 140a, block 2 140b, block 3 140c, and so on to block n 140n. The memory blocks 140 represent a minimum size of data that can be written to the flash memory 132 during a write procedure. The minimum size varies according to the brand of the flash memory. The flash manager 136 is configured to collect data sections for the image 139 in the new memory block 138 in RAM 130. When the new memory block size reaches one-half the minimum block size, the data sections comprising the new memory block are written to the flash memory 132 to update the operating system 139. If the RAM 130 includes more than one new memory blocks 138, then each new memory block 138 is written to the flash memory 132 when it reaches a size of at least one-half of the minimum block size.

It is noted that, although the present example describes an operating system 139 in the PDA 104 as being the image in flash memory 132 that is incrementally updated, the image may be any updateable flash-memory-resident program, data file, picture file, etc.

FIG. 2 is a flow diagram outlining the acts performed by the server 102 to create the differences file 120 from the old image 114 and the new image 116. In the present example, the updated image is an updated device operating system for the PDA 104.

Creating the differences file 120 is accomplished by applying a compression algorithm to the new image 116, using the old image 114 as a reference. Since the old image 114 is already stored on the PDA 104, data from the new image 116 that is also contained in the old image 114 does not need to be downloaded from the server 102 to the PDA 104. When the new image 116 is created at the PDA 104, data that is contained in both images is copies from the image 139 already on the PDA 104. Data that is only contained in the new image 116 is downloaded to the PDA 104 in the modified differences file 124 and is copied to the flash memory image 139.

The differences file 120 and the modified difference file 124 are composed of two alternating types of sections: data sections contain data from the new image 116 that is not found in the old image 114; copy sections contain data that is found in both the new image 116 and the old image 114. To distinguish between the two types of sections, a header is placed at the beginning of each section, the header giving specific information about the section that follows the header.

FIG. 2a is an illustration of a more detailed example of the old image 114. The old image 114 includes four sections of data. Data in section 114a is depicted as 'abc'; data in section 114b is 'def'; data in section 114c is 'ghi'; and data in section 114c is 'jkl'. The old image 114 in FIG. 2a is simplified for discussion purposes. In practice, an image will probably contain many more sections of data than shown herein.

FIG. 2b is an illustration of an example of the new image 116. The new image 116 includes five sections of data, three of which have the same data as sections in the old image 114 shown in FIG. 2a. Data in section 116a is shown as 'abc'; data in section 116b is 'xyz'; data in section 116c is 'def'; data in section 116d is 'pqr'; and data in section 116e is 'jkl'.

FIG. 2c depicts the differences file 120 that is obtained from the old image 114 and the new image 116. A header 120a is located at the beginning of the differences file 120. Section 120b follows header 120a and contains a reference to section 114a ('abc') in the old image 114. Since the new image 116 contains a section of data identical to section 114a ('abc'), then a reference may be included and the section having data 'abc' may be taken from the old image 114 when building the new image 116 on the PDA 104.

Header 120a is associated with section 120b of the differences file 120. Header 120a includes information that section 120b is a copy section, and that section 120b is eight (8) bytes in length (a header may be any pre-defined length; eight bytes is exemplary only).

Header 120c follows section 120b and corresponds to section 120d, which follows. Section 120d is a data section having the data 'xyz'. Since 'xyz' is not contained in the old image 114, data section 120d must contain 'xyz', which will be used to construct the new image 116 on the PDA 104.

Likewise, header 120e corresponds to section 120f, which contains a reference to section 114b in the old image 114. Header 120g corresponds to section 120h, which, like section 116d, has data 'pqr', since 'pqr' is not contained in the old image 114. Header 120i corresponds to section 120j, which contains a reference to section 114d of the old image 114, since section 114d and section 116e of the new image 116 contain the same data.

If the data sections take up four thousand (4000) bytes of memory, the references take up eight (8) bytes each, and the headers take up eight (8) bytes each, then a memory saving of almost twelve thousand (12,000) bytes has been attained. This is because the new image—which is twenty thousand (20,000) bytes—is represented by the differences file 120 in only eight thousand sixty-four (8,064) bytes.

Even on the small scale demonstrated by this example, the memory savings reach the order of sixty percent (60%). More importantly, the time it takes to download the differences file is significantly less than the time required to download the entire new image.

Figure 3:
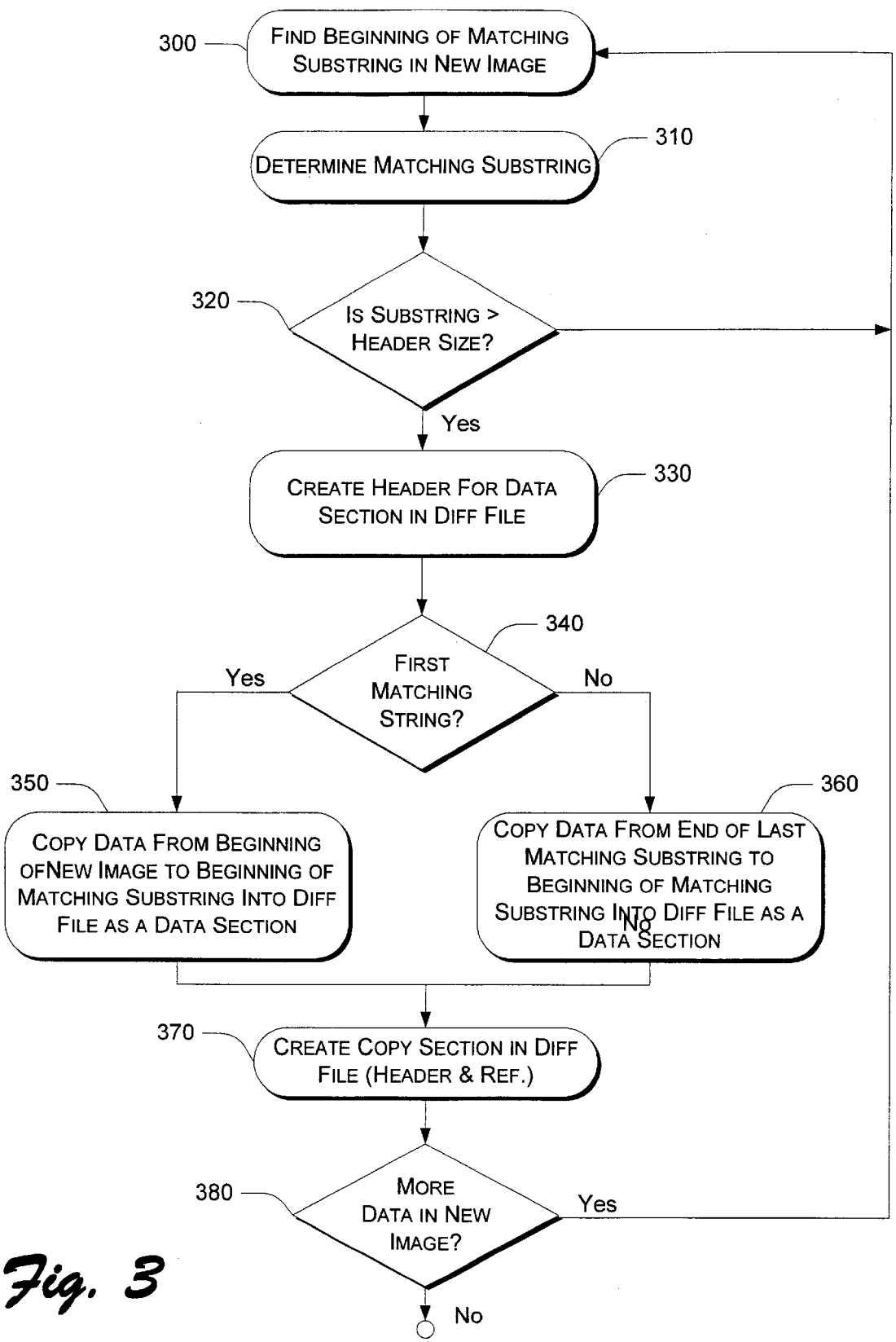
FIG. 3 is a flow diagram that depicts how the differences file 120 is constructed from the old image 114 and the new image 116.

FIG. 3 is a flow diagram that depicts how the differences file 120 is constructed from the old image 114 and the new image 116. As shown herein, this example is performed by compression module 118 on the server 102. The compression module 118 scans the new image 116 and the old image 114 until it finds a beginning of a matching substring (step 300). The beginning of a matching substring is any data in the new image 116 that matches data in the old image 114. At step 310, a length of the matching substring is determined and the length of the matching substring is compared to a length of a header used in the differences file 120 (step 320). In the present example, the length of a header is eight bytes, including a reference to a data section from the old image 114. Since the goal of the compression is to reduce the size of the new image 116, any copy section must be of a greater size than the header and reference that will represent the section in the differences file 120.

If the matching substring is smaller than a header ("No" branch, step 320), then the compression module 118 ignores the matching substring and reverts to step 300 to search for the next matching substring. If the matching substring is larger than a header ("Yes" branch, step 320), then a header is created for a data section for the difference file 120 at step 330. If the matching substring is the first matching substring found in the compression process, then at step 350, the data of the new image 116 from the beginning of the new image 116 to the beginning of the matching substring is copied into the differences file 120 as a data section ("Yes" branch, step 340). If the matching substring is not the first matching substring ("No" branch, step 340), then data of the new image from the end of the previous matching substring to the beginning of the matching substring is copied into the differences file 120 as the data section (step 360) that corresponds with the previously created header.

A header is created for a copy section at step 370. This header contains a reference to the location of the matching substring in the old image 114. The matching substring will not be copied into the differences file 120 because the matching substring will be copied from the old image 139 in the PDA 104 to create the new image 139 (overwritten on the old image) in the PDA 104.

At step 380, a determination is made as to whether there is additional data in the new image 116 and, if so, the process continues again at step 300 to search for another matching substring ("Yes" branch, step 380). Otherwise, the process is terminated and the differences file 120 is complete ("No" branch, step 380).

It is desirable to expand the differences file 120 incrementally to create the new image 139 on the PDA 104 to avoid the memory requirements of building the new image in temporary memory (RAM 130) before re-programming the flash memory 132. This poses a problem due to the fact that some copy sections in the differences file 120 ("dependent data sections") require data from data sections of the old image 114 to be constructed. Since the old image 139 in flash memory 132 is being overwritten as the new image 139 in the flash memory 132 is built, it is possible that a dependent data section will require data from one or more data sections from the old image 114 that have been overwritten.

To overcome this problem, the data sections must be reordered so that data sections having data that is not referenced by any other data section are written first. But it could happen that a first section requires data from a second section, and the second section requires data from the first section. This loop—called a "cyclic reference"—prevents one data section from being written before the other.

One solution to the problem of cyclic references is to temporarily buffer both data sections in the RAM 130, then write both the sections to the flash memory 132 at the same time. This solution may work for a simple cycle consisting of only two data sections, but a cycle can consist of any number of data sections. If a large number of data sections are cached in the RAM 130, then the aim of compression and incremental construction is defeated.

A solution described herein eliminates the cycle by breaking one or more of the references in the cycle. A reference is broken by substituting a data section for a copy section (i.e., a reference). In summary, the solution is to identify all cyclic references in the differences file 120, break one or more references so that there are no cycles, and sort the sections in such a way that no section to be written requires data from a section of flash memory that has already been overwritten.

Figure 4:
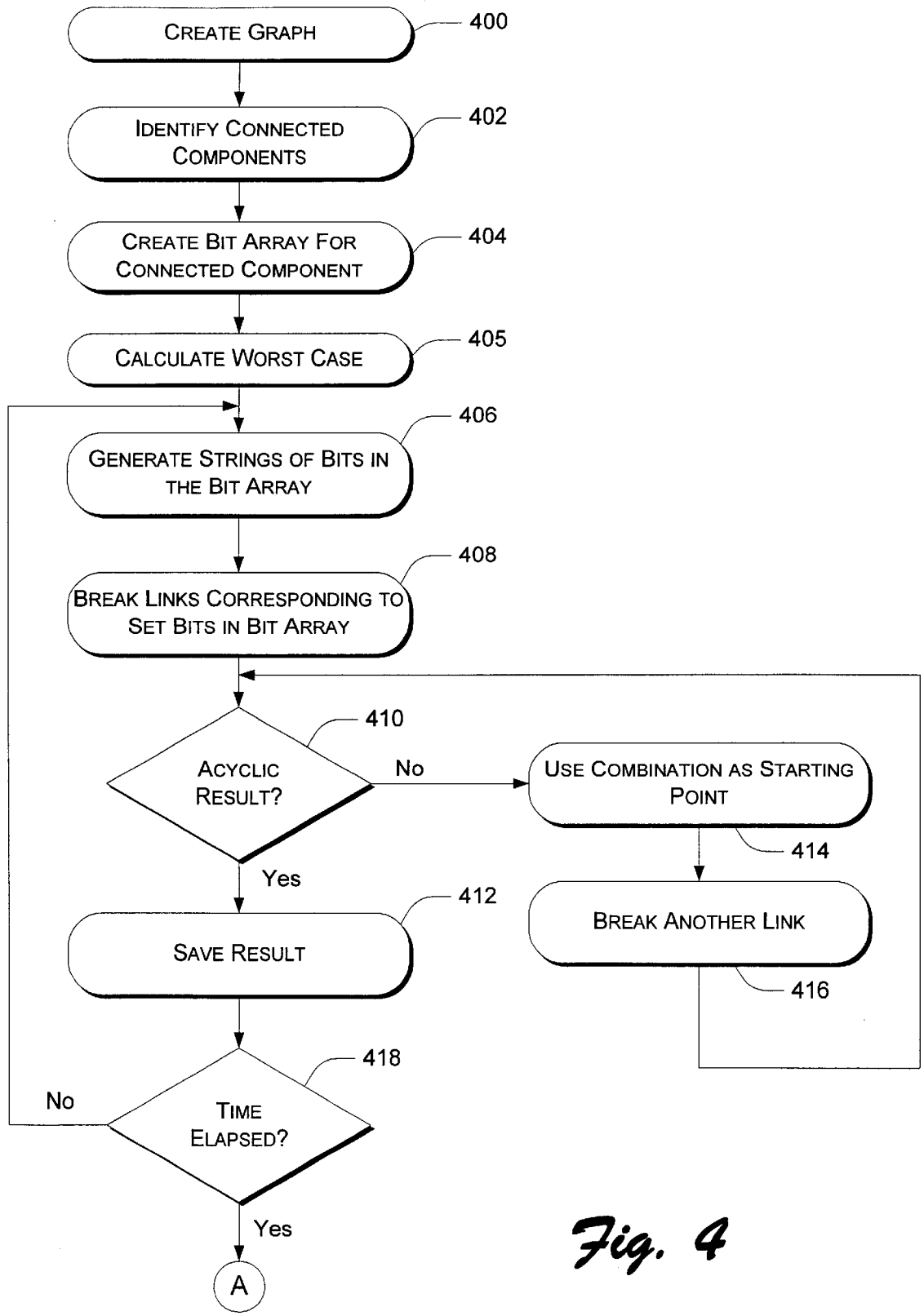
FIG. 4 is a flow diagram depicting a method of reordering data sections so no section to be written requires data from a section of flash memory that has already been overwritten.
Figure 4:
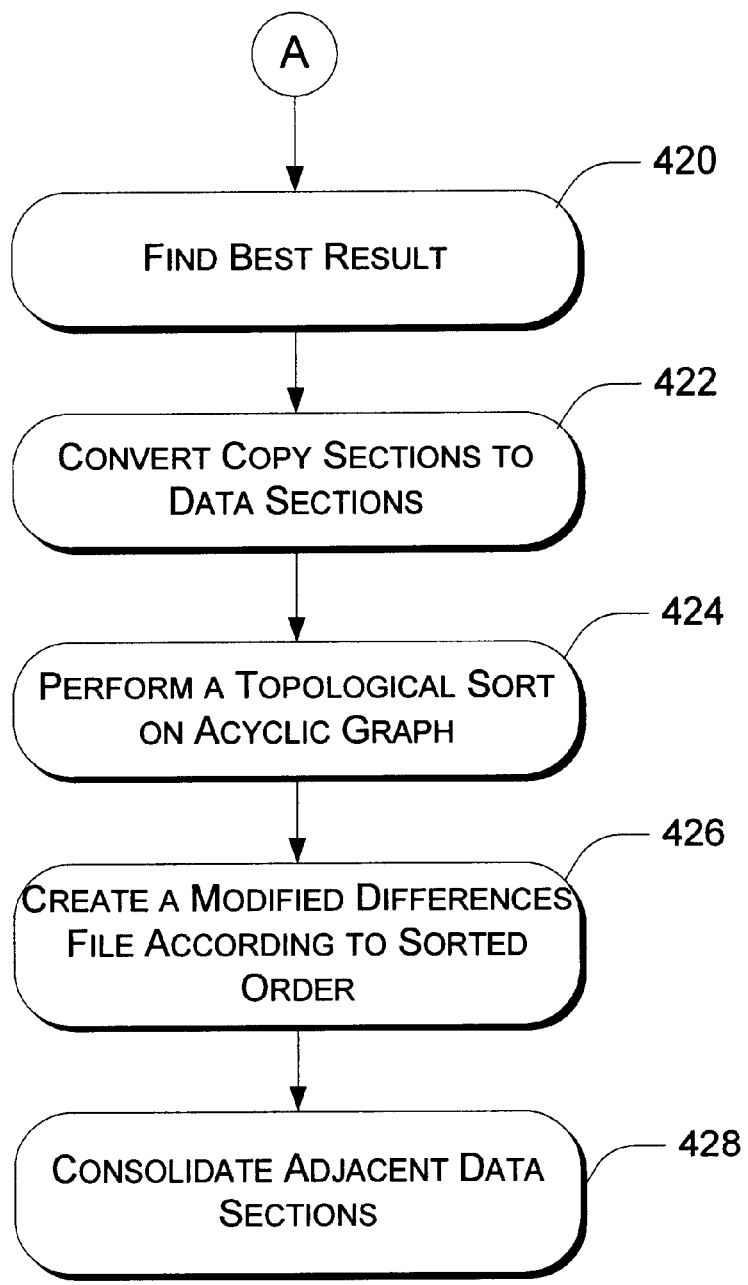

FIG. 4 is a flow diagram depicting a method in which this is accomplished. In the present example, this method is performed by the reordering module 122. At step 400, a graph is created wherein data sections are represented as nodes, and wherein data taken from a first node (data section) by a second node (data section) is represented by an edge between the first node and the second node. Each edge has a direction and a weight. The direction indicates which node is taking the data, and the weight is the amount of data taken.

Figure 5:
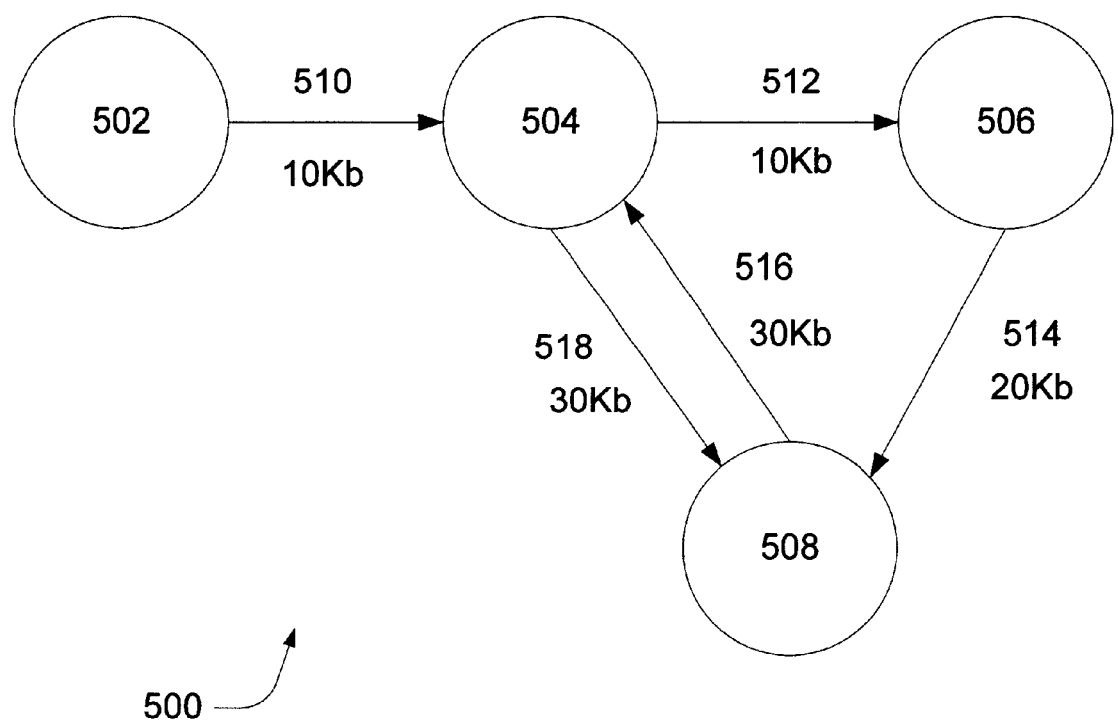
FIG. 5 is an illustration of a portion of a graph having nodes and edges.

FIG. 5 illustrates a portion of a graph 500 created at step 400. Graph 500 includes node 502, node 504, node 506 and node 508. Edge 510 connects node 502 and node 504, and has a weight of 10 Kb. This indicates that the data section represented by node 504 requires 10K bytes of data from the data section represented by node 502. Edge 512 connects node 504 and node 506 and has a weight of 10 Kb. Edge 514 connects node 506 and node 508 and has a weight of 20 Kb. Edge 516 connects node 508 and node 504 and has a weight of 30 Kb. Edge 518 also connects node 508 and node 504 (in the opposite direction of edge 516) and has a weight of 40 Kb.

Node 504, node 506 and node 508 represent dependent data sections that require data from one or more other data sections. These nodes make up a "strongly connected component," which may be described as a subgraph, or set of nodes, wherein each node is reachable from every other node. The edges 516, 518 connecting node 504 and node 508 comprise a cyclic reference, i.e., the data section represented by node 504 requires data from the data section represented by node 508 and vice versa. Continuing reference will be made to FIG. 5 in the discussion of FIG. 4.

Referring back to FIG. 4, the graph representing the data sections and references in the differences file 120 has been created at step 400. This graph is a weighted, directed cyclic graph. To properly reorder the data sections and references, two graph problems must be solved: (1) Given a graph G–(V, E), what is the smallest set of edges (E') that can be deleted to result in an acyclic graph?; and (2) Given a directed acyclic graph G=(V, E), find a linear ordering of the vertices of V, such that for each (I, j) belonging to E, vertex I is to the left of vertex j (topological sorting). Solving the first problem eliminates all cyclic references, and solving the second problem reorders the data sections in a manner such that the differences file 120 can be expanded and the new image incrementally written to flash memory 132 as the differences file 120 is expanded.

The second problem is a simple problem with a solution in polynomial time. But the first problem has been identified as an NP-complete problem (NP=non-deterministic polynomial). NP-complete problems do not have a solution in polynomial time, but in exponential time (which is significantly longer). The straightforward solution to the first problem is to test all possible combinations of links to break and determine which combinations leave an acyclic graph. This solution runs in exponential time, which is prohibitively slow.

Instead, the first problem is broken down by first identifying all strongly connected components in the graph (step 402). If all strongly connected components are converted into directed acyclic graphs, then the entire graph also becomes a directed acyclic graph.

In the standard algorithm for finding strongly connected components, a depth first search of the graph is performed, and finishing times for each node are marked. The direction of the arrows is reversed to get the transpose of the adjacency matrix, and the depth first search is repeated in decreasing order of the finishing times. The array of nodes visited from each node contains the strongly connected components of the graph.

Even after this, in practice, strongly connected components may be identified that have fifty or more nodes. Testing every single combination of links to break would still be prohibitively slow. Therefore, at step 404, a bit array is created for a strongly connected component, the size of the bit array being the number of links in the strongly connected component. A worst-case scenario is calculated at step 405 by assuming every single link is broken and adding the weight of every link that is broken. The worst-case scenario can then be used for comparison with possible solutions.

At step 406, random, non-repeating strings of bits in the bit array are generated. For each string, links corresponding to the set bits in the bit array are broken (step 408). At step 410, a determination is made as to whether this results in an acyclic graph. If so, ("Yes" branch, step 410), then the result is saved at step 412. If the result is still a cyclic graph ("No" branch, step 410), then the result is used as a starting point at step 414, and another link is broken at step 416. The process then reverts to step 410 to determine if an acyclic graph has been produced, and the process continues until it results in an acyclic graph.

If a pre-determined amount of time has not elapsed ("No" branch, step 418), then the process is done for many strings. When the time has expired ("Yes" branch, step 418) or when all combinations have been tested, the "best" result is determined at step 420. The best result is the one that results in an acyclic graph and which requires breaking links with the lowest total weight. Once the best result is found, at step 422 the appropriate links are broken by converting copy sections to data sections for the links to be broken. A topological sort is performed on the resulting acyclic graph at step 424. The modified differences file 124 is then constructed according to the order of the sorted graph (step 426).

At step 428, a final pass is made over the modified differences file 124 to identity any adjacent data sections. Sequential data sections can arise if, in the process of converting and reordering the sections, a copy section embedded between two data sections is converted into a data section. This results in a smaller modified differences file.

Referring back to FIG. 2d, the modified differences file 124 that results from reordering the differences file 120 shown in FIG. 2c is illustrated. For this example, it is assumed that section 120d ('xyz') of the differences file 120 requires data from section 120b ('abc') of the differences file 120 to be constructed.

The modified differences file 124 includes a header 124a and its corresponding section 124b ('xyz'); header 124c and its corresponding section 124d (reference to 'abc'); header 124e and its corresponding section 124f (reference to 'def'); header 124g and its corresponding section 124h ('pqr'); and header 124i and its corresponding section 124j (reference to 'jkl'). Since section 124b requires data referenced by section 124d, section 124b appears before 124d in the modified differences file 124. This ensures that the data section referenced by section 124d will be available when section 124b ('xyz') is constructed.

Figure 6:
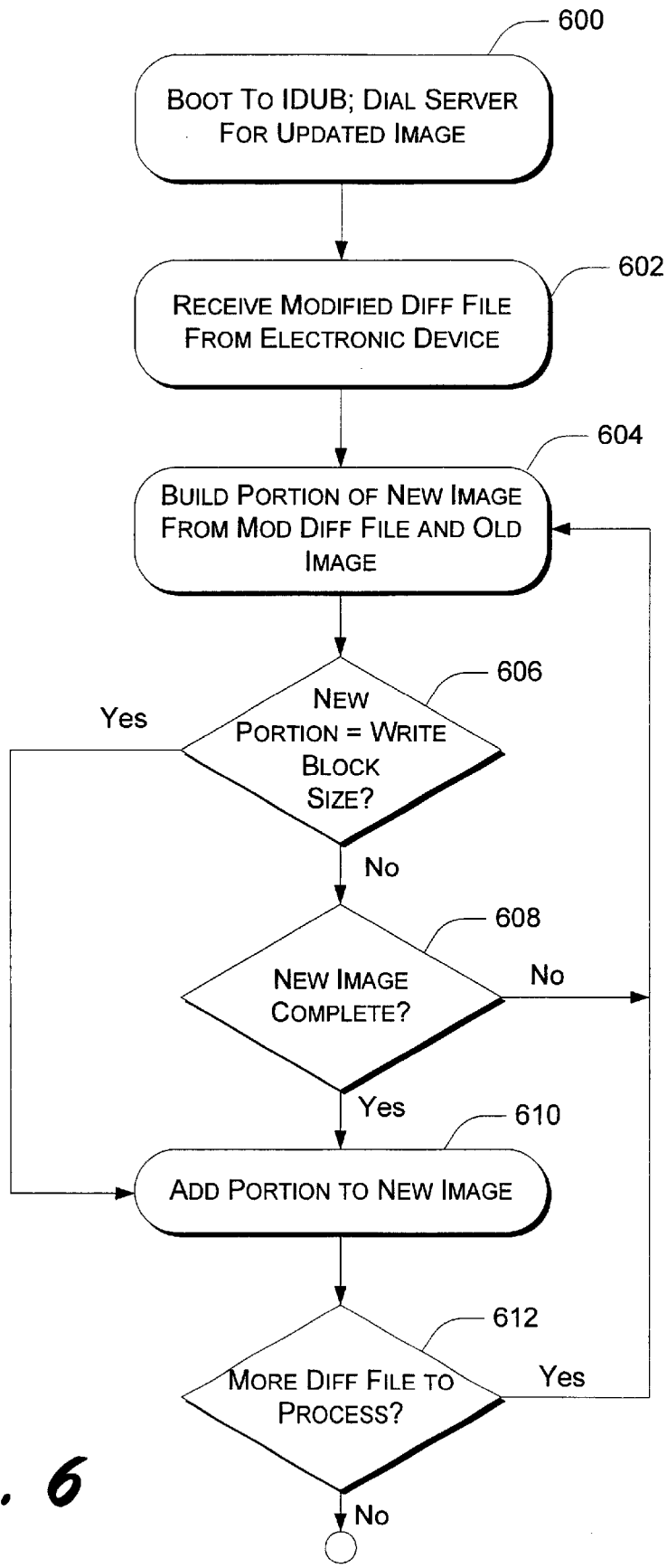
FIG. 6 is flow diagram illustrating a method for incrementally updating an image in flash memory from a modified differences file.

FIG. 6 illustrates the process performed on the PDA 104 to incrementally update the image 139 in flash memory 132. At step 600, the PDA 104 boots into the incremental dial-up bootloader 134 and dials into the server 102 to download the modified differences file 124. The modified differences file 124' is downloaded to the PDA 104 and stored in the RAM 130 at step 402.

The flash manager 136 uses the modified differences file 124' and the image 139 in flash memory 132 (the old image) to start building the new image. At step 404, a portion of the new image is constructed and temporarily stored in the new memory block 138. When the new memory block 138 contains a portion of the new image that constitutes at least one-half of a write block size for the flash memory 132 ("Yes" branch, step 406), then the portion of the new image stored in the new memory block 138 is added to the image 139 in the flash memory 132. As previously discussed, the size of a write block depends on the type of flash memory, i.e., the brand of the flash memory. It is common for flash memory to have a write block of 64 Kb. Also as previously discussed, the flash manager 136 may manage several new memory blocks 138. When any of the new memory blocks 138 reaches a size of one-half of a write block size, that new memory block 138 is written to the flash memory.

It is noted that, when the image 139 is reconstructed in flash memory 132 from the new memory block(s) 138, the image 139 is not necessarily created linearly. In other words, non-adjacent blocks may be written as the new image 139 is built.

If the portion of the new image in the new memory block 138 is smaller than a write block for the flash memory 132, then it is determined if the modified differences file has been completely processed at step 408. If processing has completed ("Yes" branch, step 408), then the portion of the new image contained in the new memory block 138 is added to the new image in flash memory 132 (step 410) even if it is smaller than a write block, since there is no more data to process. If there is still more data to process ("No" branch, step 408), then the process reverts to step 404 and a more of the modified differences file 124' is processed to build the new image.

The new image incrementally overwrites the old image 139 in the flash memory 132 until the new image 139 is complete. This has now been accomplished without first having to build a complete copy of the new image in the RAM 130 of the PDA 104 before writing the new image to flash memory.

Although the invention has been described in language specific to structural features and/or methodological steps, it is to be understood that the inventions defined in the appended claims are not necessarily limited to the specific features or steps described. Rather, the specific features and steps are disclosed as preferred forms of implementing the claimed invention(s).

What is claimed is:

1. A method, comprising:
    creating a differences file from a first image and a second image, the second image including data sections from the first image and new data sections, the differences file including pointers to the data sections of the first image that are included in the second image and the new data sections from the second image;
    identifying dependent data sections that require data from one or more referenced data sections; and
    reordering the data sections and pointers so that no dependent data section requires data from a referenced data section that precedes it in the order.

2. The method as recited in claim 1, further comprising creating a modified differences file that contains the ordered data sections and pointers.

3. The method as recited in claim 1, further comprising writing the referenced data sections and the new data sections to memory according to the reordering to produce the second image in memory from the first image and the differences file.

4. The method as recited in claim 3, wherein the data sections are written to memory in blocks of a predefined size of memory.

5. The method as recited in claim 3, the second image overwriting the first image in the memory.

6. The method as recited in claim 1, the reordering further comprising:
   identifying cyclic references between referenced data sections; and
   breaking one or more references in the cyclic references so that there are no cyclic references between referenced data sections.

7. The method as recited in claim 6, wherein the breaking one or more references further comprises breaking one or more references that reference the smallest amounts of data to remove the cyclic references.

8. The method as recited in claim 1, the reordering further comprising:
   creating a directed graph of nodes and edges wherein each node corresponds to a referenced data section in the first image and each edge being indicative of a section taking data from another section;
   assigning a weight to each edge to create a weighted directed graph, the weight of an edge being the amount of data taken by one node connected to the edge from the other node connected to the edge;
   determining the smallest set of edges that, when deleted, results in a weighted directed acyclic graph;
   deleting at least one edge in the determined smallest set of edges; and
   topologically sorting the weighted directed acyclic graph.

9. The method as recited in claim 8, wherein deleting an edge comprises replacing a reference to a data section in the differences file with the data section.

10. A method for overwriting an old image in flash memory with a new image, the new image containing data sections from the old image and new data sections, the method comprising:
    accessing a differences file that contains references to data sections from the old image that are included in the new image, and the new data sections from the new image;
    identifying dependent data sections as being data sections that require data from one or more referenced data sections;
    ordering the references to data sections from the old image and the new data sections so that a dependent data section precedes the one or more referenced data sections from which it requires data; and
    writing the new image in flash memory according to the ordering, the new data sections being copied from the differences file and the referenced data sections being copied from the old image.

11. The method as recited in claim 10, further comprising creating a modified differences file that contains the ordered references and data sections.

12. The method as recited in claim 10, the ordering further comprising:
    creating directed graph of nodes and edges wherein each node corresponds to a referenced data section in the old image, and each edge indicating that a first node connected to a first end of an edge takes data from a second node connected to a second end of the edge;
    creating a weighted directed graph from the directed graph by assigning a weight to each edge, the weight of an edge being an amount of data taken by the first node from the second node;
    determining a smallest set of edges that can be deleted to derive a weighted directed acyclic graph;
    deleting the set of edges; and
    performing a topological sort on the weighted directed acyclic graph.

13. The method as recited in claim 10, the ordering further comprising:
    identifying cyclic references between referenced data sections; and
    converting the cyclic references to acyclic references by breaking one or more references within each cyclic reference.

14. The method as recited in claim 13, wherein the breaking one or more references further comprises breaking one or more references that reference the smallest amounts of data possible to remove the cyclic references.

15. The method as recited in claim 10, further comprising creating the difference file.

16. The method as recited in claim 10, further comprising receiving the difference file from a computing device.

17. A computer readable medium containing computer-executable instructions that, when executed by a computer, perform the following:
    accessing a differences file that contains references to data sections from a first image that are included in a second image, and new data sections that are included in the second image;
    identifying dependent data sections that require data from one or more referenced data sections in the first image; and
    reordering the references to data sections from the first image and the new data sections so that each dependent data section precedes the one or more referenced data sections from which it requires data.

18. The computer readable medium as recited in claim 17, further comprising computer-executable instructions that, when executed on a computer, perform the step of creating a modified differences file containing the data sections and references of the differences file in the order derived by the reordering.

19. The computer readable medium as recited in claim 17, further comprising computer-executable instructions that, when executed on a computer, perform the step of writing the referenced data sections and the new data sections to memory in the order derived by the reordering to store the second image in the memory.

20. The computer readable medium as recited in claim 19, wherein the new data sections are copied into the memory from the differences file, and the data sections in the first image that are referenced by the differences file are copied into the memory from the first image.

21. The computer readable medium as recited in claim 19, wherein the memory is flash memory that accepts write data in blocks having a minimum size, and the computer readable medium further comprises computer-executable instructions that, when executed on a computer, perform the following:
    incrementally constructing the second image in random access memory until there is a portion of the second image that is the minimum size to be written to the flash memory;
    writing the portion of the second image to the flash memory; and
    writing a remainder of the second image to the flash memory when data sections remaining to be written are insufficient to make up a block of the minimum size.

22. The computer readable medium as recited in claim 19, wherein the referenced data sections and the new data sections are written to a memory location where the first image is stored, overwriting the first image.

23. The computer readable medium as recited in claim 17, further comprising computer-executable instructions that, when executed on a computer, perform the step of creating a modified differences file to store the reordered new data sections and references to data sections from the old image.

24. The computer readable medium as recited in claim 17, further comprising computer-executable instructions that, when executed on a computer, perform the steps of:
identifying cyclic references between referenced data sections; and
breaking one or more references in the cyclic references so that there are no cyclic references between referenced data sections.

25. The method as recited in claim 24, wherein the breaking one or more references further comprises breaking one or more references that reference the smallest amounts of data to remove the cyclic references.

26. The computer readable medium as recited in claim 17, further comprising computer-executable instructions that, when executed on a computer, perform the steps of:
creating a representation of a directed graph of nodes and edges wherein each node corresponds to a referenced data section in the first image and each edge being indicative of a section taking data from another section;
assigning a weight to each edge to create a representation of a weighted directed graph, the weight of an edge being the amount of data taken by a receiving node connected to a receiving end of the edge from a taking node connected to a taking end of the edge;
determining the smallest set of edges that, when deleted, results in a representation of a weighted directed acyclic graph; and
topologically sorting the representation of the weighted directed acyclic graph.

27. A system, comprising:
a processor;
memory;
an image stored in the memory and containing data sections;
an updated image stored in the memory, containing one or more data sections from the image and new data sections;
a compression module configured to create a differences file, the differences file including the new data sections of the updated image and references to the data sections in the image that are also contained in the updated image; and
an ordering module configured to reorder the references and new data sections in the differences file and store the reordered references and new data sections in a modified differences file so that any data section requiring data from one or more referenced data sections comes before the one or more referenced data sections.

28. A system as recited in claim 27, further comprising a reference substitution module that is configured to:
identify cyclic references between referenced data sections;
remove one or more references in each cyclic reference to eliminate the cyclic references; and
wherein a reference is removed by substituting a data section for a reference to the data section in the differences file.

29. An incremental dial-up bootloader, comprising:
a dial-up bootloader operating system, configure to download a differences file;
an incremental module configured to apply the differences file to a first image to produce a second image that is an updated version of the first image; and
a flash manager to create the second image incrementally until a portion of the second image is of a standard size to write to the flash memory and to write portions of the second image to the flash memory until the second image is stored in the flash memory.

* * * * *